United States Patent [19]

Mizuno et al.

[11] Patent Number: 5,731,710

[45] Date of Patent: Mar. 24, 1998

[54] CONTACT PROBE APPARATUS USED IN ELECTRIC TESTS FOR A CIRCUIT BOARD

[75] Inventors: Kouichi Mizuno, Toyota; Joji Morimoto, Anjo, both of Japan

[73] Assignee: Nippondenso Co., Ltd., Kariya, Japan

[21] Appl. No.: 840,272

[22] Filed: Apr. 14, 1997

Related U.S. Application Data

[63] Continuation of Ser. No. 363,224, Dec. 23, 1994, abandoned.

[30] Foreign Application Priority Data

Dec. 24, 1993 [JP] Japan ............................ 5-328647

[51] Int. Cl.⁶ .................................................. G01R 31/02
[52] U.S. Cl. .......................... 324/761; 324/72.5; 324/754; 439/824
[58] Field of Search ............................. 324/72.5, 754, 324/761; 439/482, 700, 824, 884

[56] References Cited

U.S. PATENT DOCUMENTS

| | | | |
|---|---|---|---|
| 4,307,928 | 12/1981 | Petlock, Jr. ........................ | 439/824 |
| 4,686,465 | 8/1987 | Kruger ............................. | 439/482 |
| 4,885,533 | 12/1989 | Coe ................................ | 439/482 |
| 5,009,613 | 4/1991 | Langgard et al. .................. | 439/482 |
| 5,032,787 | 7/1991 | Johnston, et al. ................. | 324/761 |

FOREIGN PATENT DOCUMENTS 60-127466   7/1985   Japan.

*Primary Examiner*—Vinh P. Nguyen
*Assistant Examiner*—Russell M. Kobert
*Attorney, Agent, or Firm*—Cushman, Darby & Cushman IP Group of Pillsbury, Madison & Sutro LLP

[57] ABSTRACT

A test probe contact comprises a plunger 1 having a pointed tip 4 formed into a pyramid configuration having an apex 9 and a plurality of slant faces 10—10 meeting at the apex 9 so as to form a ridge 8 between adjacent two slant faces 10 and 10. The pointed tip 4 is connectable with a check land 11 of a test member. A barrel 2 holds the plunger 1 therein so that the plunger 1 slides in an axial direction thereof. A sliding movement of the plunger 1 causes the ridge 8 of the pointed tip 4 to cut the surface of the check land 11 along a ridgeline of the ridge 8. A spring 3 resiliently supports the plunger 1 in the axial direction of the plunger 1 for giving an elastic reaction force to the plunger 1 when plunger 1 is pushed against the check land 11, thereby breaking through the surface of the check land 11 by the ridge 8 so as to establish an electrical connection between the pointed tip 4 and the metal portion of the check land 11.

13 Claims, 8 Drawing Sheets

CONTACT PROBE APPARATUS USED IN ELECTRIC TESTS FOR A CIRCUIT BOARD

This is a continuation of application Ser. No. 08/363,224, filed on Dec. 23, 1994, which was abandoned upon the filing hereof.

BACKGROUND OF THE INVENTION

1. Field of the Invention

The present invention relates to an electrical test probe contact capable of establishing an excellent electrical connection to a test object such as a printed circuit board.

2. Prior Art

A well-known conventional probe contact comprises a plunger having a pointed tip directly brought into contact with a test surface of an electronic component, and a coil spring giving a pressing force to this plunger.

Configuration of the pointed tip of such a probe contact is generally a cone which has a sharp apex and a circular cross section normal to the axis of the plunger. A conductive or performance test is carried out by pushing the pointed tip directly to the test surface of an electronic component (e.g. a measuring check land having a plane surface on a printed circuit board). In other words, it is necessary to give a pressing force to the plunger to establish an electrical connection between the pointed tip and the test surface.

The test surface is generally covered by a non-conductive layer, such as a flux or oxide film formed in a soldering operation or the like. Therefore, it is necessary to break through such a non-conductive layer to establish an electrical connection between the test probe contact and the test surface. This is why a significant amount of pressing force is required for operating this kind of test probe contact. In short, the test probe contact is inherently faced with a problem of how the non-conductive layer is effectively removed to establish a satisfactory electrical connection to the test surface of an electronic component.

Recently, prohibition of freon used in various devices is becoming a mandatory subject to be solved in view of protection of the ozone layer. Thus, freon or solvent such as trichloroethane cannot be used to clean the surface of a printed circuit board any more, resulting in omission of cleaning processing of printed circuit boards. Hence, residual flux is accumulated on the test surface of the printed circuit board with a thickness which is too large to easily break through. To assure a good electrical connection between the test probe contact and the test surface, surely breaking through such a tough residual flux is absolutely necessary.

However, the above-described conventional test probe contact is encountered with a problem derived from the configuration of its conical pointed tip, which will be explained below with reference to FIG. 9. When a pushing force is applied, a pointed tip 19 enters into or mushes a solder layer 21 by a head 20 located at the front end of the pointed tip 19. A residual flux film 22, accumulated on the surface of the solder layer El, is broken into flux chips 23—23 by the pointed tip 19. Some of the flux chips 23—23 are pushed inward together with the head 20 and others adhere on a slope 24. Thus, it is difficult to gain an electrical connection at the head 20.

Furthermore, each flux chip 23 residing along a conical slope 24 tends to lower contact pressure between the test probe contact and the solder surface so greatly that an effective electrical connection cannot be obtained in the region of the slope 24.

Accordingly, it is difficult for the above-described conventional test probe to surely break through the residual flux film 22, thus failing to establish an acceptable electrical connection with the solder layer 21 in the event that a cleaning operation is omitted.

To solve such a problem, there is proposed a probe contact having an arrangement for rotating a pointed tip to gain a better electrical connection to the test surface. The U.S. Pat. No. 5,032,787 discloses a test probe contact having a concave tip to be coupled with a projecting test leg of an electronic component provided on a printed circuit board. This concave tip is formed on a plunger. A spiral guide member and a coil spring are provided to give rotation to the plunger as well as a pushing force. The upper surface of the concave tip is formed into multiple outwardly projecting sharp-pointed tips or knife edges, as shown in FIG. 19.

However, according to the U.S. Pat No. 5,032,787, another problem arises due to rotation and a pushing force given to the plunger. Namely, with the rotation and the pushing force, the concave tip of the test probe contact is inevitably locked with the projecting test leg of an electronic component. This lock-up phenomenon causes a reaction force for stopping the plunger rotating, which is applied as a large load to the printed circuit board and increases deflection of the printed circuit board. Thus, it is feared that electronic components may be damaged.

Furthermore, this technology taught by the U.S. Pat. No. 5,032,787 necessarily requires a mechanism for rotating the tip of a test probe contact. Doubtlessly, this increases cost.

SUMMARY OF THE INVENTION

Accordingly, in view of above-described problems encountered in the prior art, a principal object of the present invention is to provide an electric test probe contact capable of establishing an excellent electrical connection to a test surface of an electronic component, such as a printed circuit board, even if the test surface is covered by a tough layer of residual flux.

In order to accomplish this and other related objects, the present invention provides a first type test probe contact which is chiefly applied to test members having a flat test surface. More specifically, the first type test probe comprises: a contact member having a pointed tip formed into a pyramid configuration having an apex and a plurality of slant faces meeting at the apex so as to form a ridge between two adjacent slant faces, the pointed tip being connectable with a test member; a holding member holding the contact member therein so that the contact member slides in an axial direction thereof, a sliding movement of the contact member causing the ridge of the pointed tip to cut into the test member along a ridgeline of the ridge; and an elastic member resiliently supporting the contact member in the axial direction of the contact member for giving an elastic reaction force to the contact member when the contact member is pushed against the test member, thereby breaking through a surface of the test member using the ridge so as to establish an electrical connection between the pointed tip and the test member.

With this arrangement, the pyramid-shaped pointed tip of the test probe contact of the present invention can realize a mechanism of effectively removing the residual flux or oxide film from the surface of the test member, utilizing the knife edge effect of the test probe ridges. More specifically, the residual flux or oxide film is completely removed from the surface of the test member in the local region along which each ridge slides or advances in accordance with the progress of the insertion of test probe contact into the test member. The effect derived from such a pyramid-shaped pointed tip is called as the "knife edge effect". Thus, the pointed tip is surely brought into contact with a metal region of the test member at least in the region of the ridges since the residual flux film is completely removed in this region. Hence, an excellent electrical connection is established between the point tip and the test member with an appropriate contact pressure.

It is preferable in the above first type test probe contact that at least one of the slant faces of the pointed tip is a concave face recessed toward an axis of the contact member.

Furthermore, it is preferable that the pointed tip has a cross section normal to an axis of the contact member and having sides having the same length.

Alternatively, the pointed tip can have a cross section normal to an axis of the contact member having sides being different each other in their length.

Furthermore, the present invention provides a second type test probe contact which is preferably applied to test members having a protruding test leg. More specifically, the second type test probe comprises: a contact member having a contact tip formed with a plurality of slits, each slit extending radially from a center of the contact tip to an outer peripheral edge thereof and having a depth along an axial direction of the contact tip so as to form an edge between two adjacent slits, the edge being connectable with a test member; a holding member holding the contact member therein so that the contact member slides in an axial direction thereof, a sliding movement of the contact member causing the edge of the contact tip to cut into the test member along the edge; and an elastic member resiliently supporting the contact member in the axial direction of the contact member for giving an elastic reaction force to the contact member when the contact member is pushed against the test member, thereby breaking through a surface of the test member using the edge so as to establish an electrical connection between the contact tip and the test member.

With this arrangement, the sharp edges formed on the contact tip of the test probe contact realizes a mechanism of effectively removing the residual flux or oxide film from the surface of the test member in the region of the ridges, utilizing both the knife edge effect and a pin point contact effect. Thus, the sharp edge is surely brought into contact with a metal region of the test member since the residual flux or oxide film is completely removed in this region. Hence, an excellent electrical connection is established between the contact tip and the test member with an appropriate contact pressure.

It is preferable in the above second type test probe contact that an upper surface of the contact tip is a recessed surface which is engageable with the test member, and the slits are formed on the recessed surface so as to form the edge between two adjacent slits.

Furthermore, it is preferable that an upper surface of the contact tip is a convex surface, and the slits are formed on the convex surface so as to form the edge between two adjacent slits.

It is also preferable that the slits are equally spaced from each other, although there is no problem that each slit has a width and a depth different from each other.

Moreover, it is preferable that at least one of the slits has a bottom inclined downward from the center of the contact tip to the outer peripheral edge of the same.

Furthermore, it is preferable that the contact member is made of an electrically conductive member and at least one of the holding member and the elastic member is made of an electrically conductive member.

BRIEF DESCRIPTION OF THE DRAWINGS

The above and other objects, features and advantages of the present invention will become more apparent from the following detailed description which is to be read in conjunction with the accompanying drawings, in which:

FIGS. 4A and 4B are views illustrating a mechanism of breaking through a residual flux film formed on a test surface using the test probe contact in accordance with the first embodiment of the present invention, wherein FIG. 4A is a vertical cross-sectional view while FIG. 4B is a plan view;

FIGS. 14A and 14B are views illustrating a breaking through mechanism in accordance with the second embodiment of the present invention, wherein FIG. 14A is a side view taken along an edge portion while FIG. 14B is a view seen from a direction of an arrow E;

FIGS. 15A and 15B are views illustrating the contacting condition between a conventional concave tip and a test leg, wherein FIG. 15A is a side view while FIG. 15B is a view seen from a direction of the arrow E;

DETAILED DESCRIPTION OF THE PREFERRED EMBODIMENTS

Preferred embodiments of the test probe contact in accordance with the present invention will be explained in greater detail hereinafter, with reference to the accompanying drawings. Identical parts are denoted by identical reference number throughout views.

First Embodiment

Figure 1:
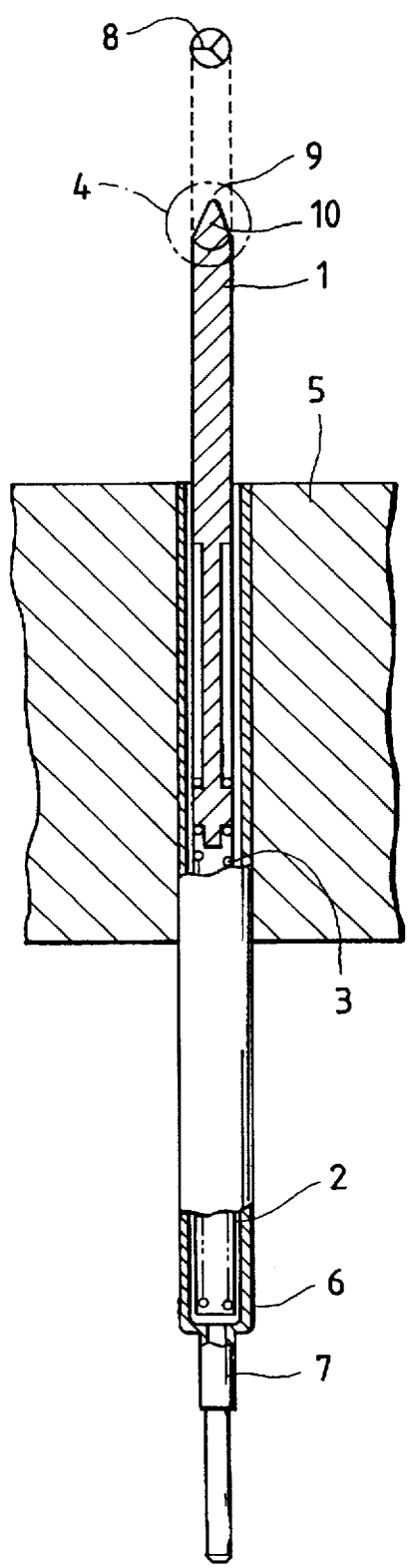
FIG. 1 is a partial sectional view schematically showing an arrangement of a test probe contact in accordance with a first embodiment of the present invention.
Figure 3:
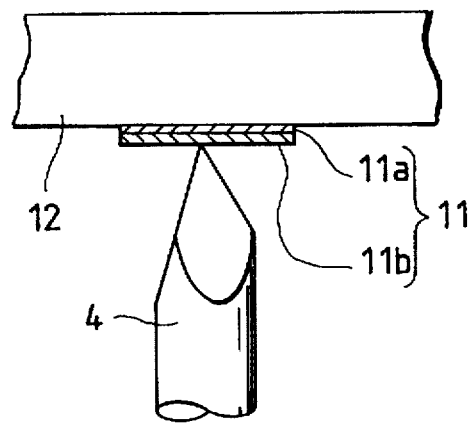
FIG. 3 is a view illustrating a testing condition of the test probe contact in accordance with the first embodiment of the present invention.

FIG. 1 is a partial sectional view schematically showing an arrangement of a test probe contact in accordance with the first embodiment of the present invention. In FIG. 1, the test probe contact comprises a plunger 1 having a pointed tip 4 (i.e. a contact tip) formed on the top thereof serving as a contact member, a barrel 2 serving as a cylindrical container accommodating the plunger 1 slidable inside thereof, and a spring 3 provided in the barrel 2 and serving as an elastic member giving a pushing force to the plunger 1. Namely, the spring 3 generates an elastic reaction force to be transmitted to the plunger 1 when the pointed tip 4 is pushed. The plunger 1 is made of an electrically conductive member. At least either one of the barrel 2 and the spring 3 is also made of an electrically conductive member. The pointed tip 4, provided on the top of the plunger 1 and constituting the contact member, is brought into contact with a check land 11 serving as a test member having a flat surface provided on a printed circuit board 12 as shown in FIG. 3. Besides being circular, the cross section of the barrel 2 can be formed into any configuration.

Figure 2:
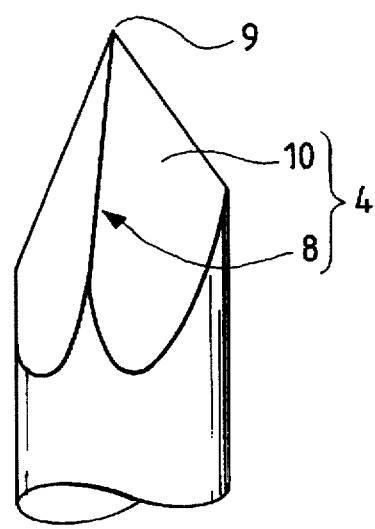
FIG. 2 is an enlarged perspective view showing a pointed tip of a plunger of the test probe contact in accordance with the first embodiment of the present invention.

The pointed tip 4 has a structure shown in the enlarged view of FIG. 2. Namely, the configuration of the pointed tip 4 is a trigonal pyramid configuration having an apex 9 and three slant faces 10, 10 and 10 meeting at the apex 9. Each slant face 10 inclines from the apex 9 toward the barrel 2. In other words, three ridges 8, 8 and 8 meeting at the apex 9 and inclinedly extending toward the barrel 2 are formed along boundaries of the three slant faces 10, 10 and 10. Namely, the slant faces 10, 10, 10 and the ridges 8, 8, 8 cooperatively constitute the pointed tip 4.

An operation of this test probe contact will be explained below.

First of all, the test probe contact is inserted into a socket 8 fixed to a table 5 of a printed circuit board test machine (not shown). The socket 8, made of an electrically conductive member, has a terminal 7. A lead line (not shown) is soldered onto the terminal 7. The pointed tip 4 is connected on the check land 11 and is pushed against the flat surface of the same without causing a rotation of the plunger 1, thereby establishing an electrical connection between the test probe contact and the circuit of the printed circuit board for a test of the printed circuit board based on signals detected by way of the lead line.

More specifically, when the test probe contact is forced against the check land 11, the plunger 1 causes a slide movement and compresses the spring 3 housed in the barrel 2. With an elastic force of the spring 3 which is proportional to the amount of compression, the pointed tip 4 pushes the check land 11 in an axial direction of the plunger 1. Thus, the pointed tip 4 forcibly enters or invades in the layer of check land 11 from its apex 9 and mushes or pushes it away partly, leaving a recess of a trigonal pyramid shape corresponding to the head of the pointed tip 4.

As shown in FIG. 3, the check land 11 serving as a test electrode of the printed circuit board 12 comprises a land copper foil 11a provided on the printed circuit board 12 and a solder layer 11b accumulated on the land copper foil 11a. Thus, when the test probe contact is pushed against such a land 11 with a significant load, the pointed tip 4 enters into the solder layer 12b from its apex 9 gaining an appropriate electrical connection to the solder layer 12b.

Figure 4A:
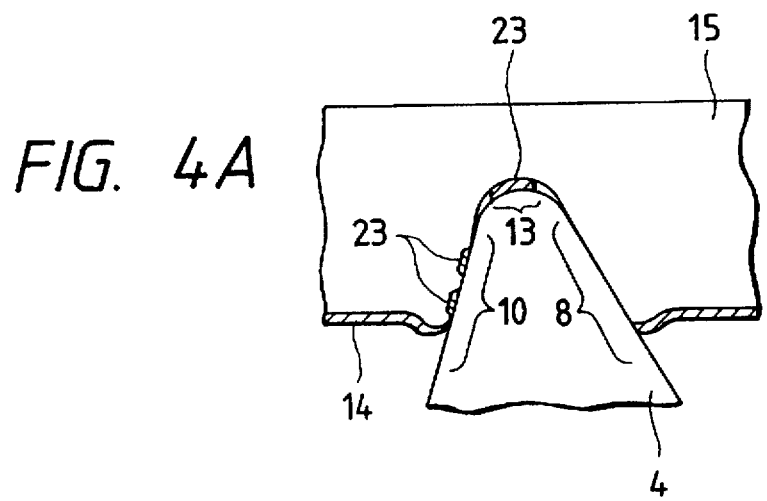
Figure 4B:
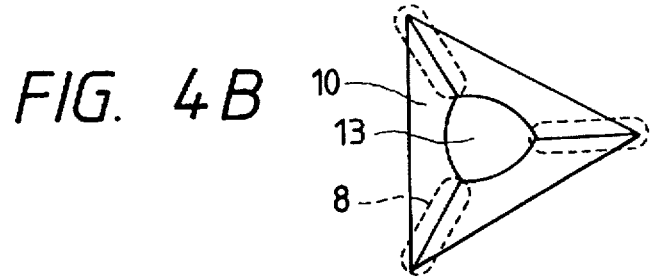

FIG. 4A illustrates a mechanism of breaking through a residual flux film formed on the test surface using the test probe contact in accordance with the first embodiment of the present invention. When the test probe contact presses the check land 11 with a predetermined load, the pointed tip 4 first breaks through the residual flux or oxide film 14 formed on the surface of the solder layer 15 by its head 13 (i.e. apex 9) and then enters or invades inside the solder layer 15 or pushes away a part of the solder layer 15, leaving a recess of a trigonal pyramid shape corresponding to the head of the pointed tip 4. When entering the solder layer 15, the pointed tip 4 advances without causing rotation. Thus, the residual flux or oxide film 14 covering the surface of the printed circuit board 12 is broken into flux chips 23—23. Some of the flux chips 23—23 are pushed inward together with the head 13 and others adhere on the slant faces 10—10. Thus, it is difficult to gain a satisfactory electrical connection in the regions of the head 13 and the slant faces 10—10 because flux chips 23—23 intervene between the pointed tip 4 and the solder layer 15 at these regions.

However, the region of the ridges 8, 8, and 8 is exception, because flux chips 23—23 do not gather or settle at or in the vicinity of the ridges 8, 8 and 8. This is a so-called knife edge effect. According to the present invention, the pointed tip 4 does not cause a rotation when it enters into the solder layer 15. In other words, the pointed tip 4 advances into the solder layer 15 sliding along ridges 8, 8 and 8 thereof. Such a sliding movement of the ridges 8, 8 and 8 of the pointed tip 4 causes a knife edge effect. Namely, with this knife edge effect, the pointed tip 4 can cut or slice the residual flux or oxide film 14 along the ridges 8, 8 and 8. In other words, a sliding movement of the pointed tip 4 causes the ridge 8 to cut into the test member along a ridgeline of the ridge 8.

The area of the residual flux or oxide film 14 to be pushed away by the pointed tip 4 is identical with the cross section of the pointed tip 4 normal to the axial direction of the plunger 1. The cross section of the trigonal pyramid normal to its axis increases with increasing distance of the cross section measured from its apex. Thus, invasion of the pointed tip 4 of a trigonal pyramid into the solder layer 15 acts to push away the residual flux or oxide film 14 from the region of ridge 8, 8 and 8 toward the region of adjacent slant faces 10, 10 and 10. Accordingly, the residual flux or oxide film 14 or the flux chips 23—23 are removed or taken away from the region of the ridges 8, 8 and 8 as the pointed tip 4 advances deeply into the solder layer 15.

In short, the knife edge effect of the pyramid-shaped pointed tip 4 of the test probe contact of the present invention can realize a mechanism of effectively removing the residual flux or oxide film 14 from the region of the ridges 8, 8 and 8. Thus, the pointed tip 4 is surely brought into contact with the solder layer 15 at least in the region of the ridges 8, 8 and 8 since the residual flux or oxide film 14 is completely removed in this region, bringing an excellent electrical connection therebetween with an appropriate contact pressure.

To obtain a highly reliable contact function at the region of ridges 8, 8 and 8, the configuration of the pointed tip 4 of the plunger 1 should be optimized taking account of both an increase of knife edge effect at each ridge 8 and an assurance of contact pressure required without increasing elastic force of the spring 3.

Regarding such an optimization, the inventors have obtained the following parameters as a result of elaborate studies.

Figure 5A:
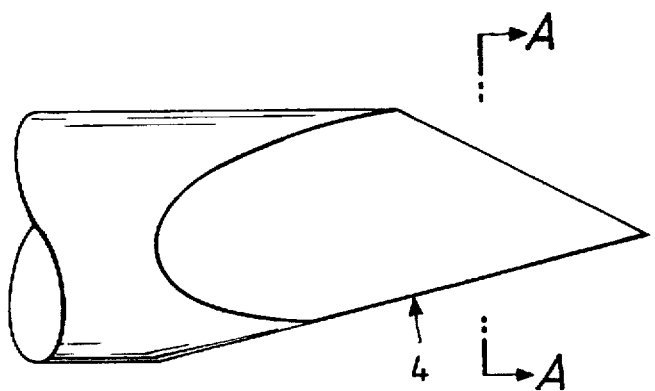
FIG. 5A is an enlarged view showing the pointed tip of the test probe contact in accordance with the first embodiment of the present invention.
Figure 5B:
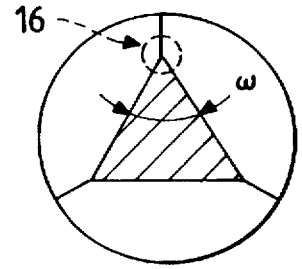
FIG. 5B is a cross-sectional view taken along a line A—A of FIG. 5A.
Figure 6A:
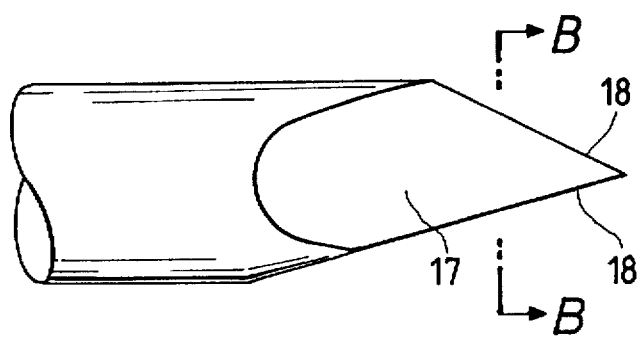
FIG. 6A is an enlarged view showing another pointed tip of the test probe contact in accordance with the first embodiment of the present invention.
Figure 6B:
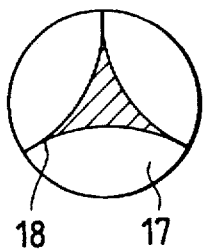
FIG. 6B is a cross-sectional view taken along a line B—B of FIG. 6A.
Figure 8A:
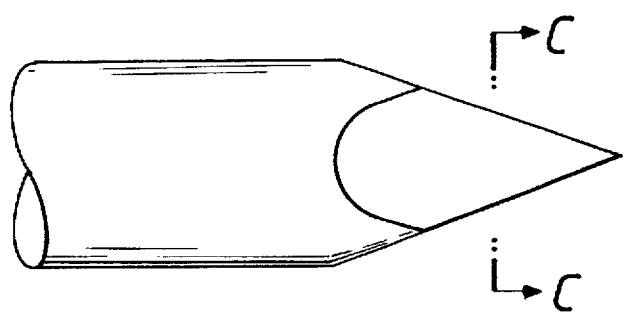
FIG. 8A is an enlarged view showing still another pointed tip of the test probe contact in accordance with the first embodiment of the present invention.
Figure 8B:
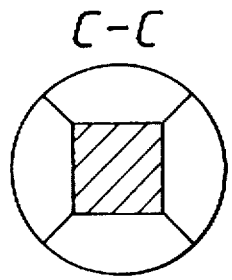
FIG. 8B is a cross-sectional view taken along a line C—C of FIG. 8A.
Figure 9:
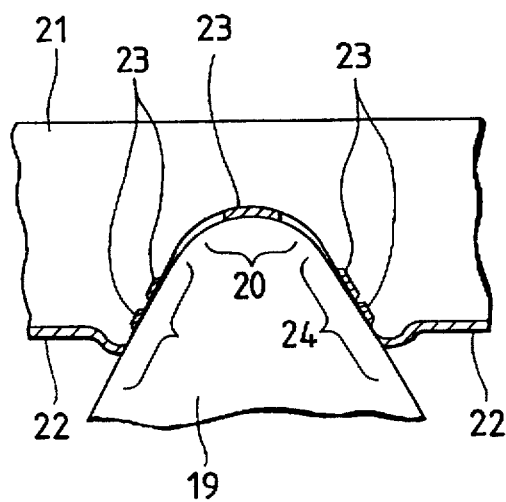
FIG. 9 is a cross-sectional view illustrating a mechanism of breaking through a residual flux film formed on a test surface using a conventional test probe contact.

First, it is preferable that the degree of sharpness of the cross section at the ridge 8 is not larger than 0.01 R. More specifically, the degree of sharpness of the cross section at the ridge 8 corresponds to a portion indicated by a reference numeral 16 in FIG. 5B which shows a cross-sectional view of the pointed tip 4 of the plunger 1 taken along a line A—A of FIG. 5A. From the view point that the knife edge effect increases with reducing an angle ω between adjacent two ridges 8 and 8, it is preferable that each slant face is formed into a concave surface recessed toward the axis of the plunger 1 as shown in FIGS. 8A and 8B, wherein FIG. 6B is a cross-sectional view taken along a line B—B of FIG. 6A which shows a pointed tip with concave slant surfaces 17, 17, 17 and ridges 18, 18, 18.

Figure 7:
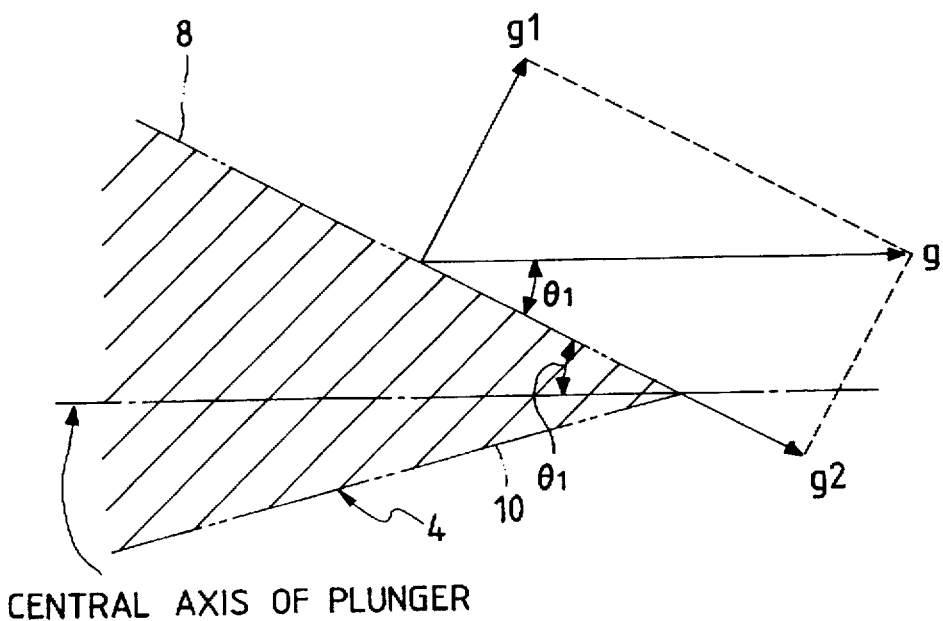
FIG. 7 is a view illustrating an angle θ1 of a ridge.

FIG. 7 is a view illustrating an angle θ1 of a ridge 8. A spring elastic force g is generally divided into two components g1 and g2. One components g1 is a force acting as driving force for advancing the pointed tip 4 into the solder layer 15 with the knife edge effect, while the other component g2 is a force acting as contact pressure for pushing the pointed tip 4 against the solder layer 15. To obtain a satisfactory contact pressure, the inventors have conducted various experiments and found an optimum result that a preferable ridge angle θ1 is in a range from 25° to 30°.

Next, the effect of the present invention will be explained with reference to FIGS. 10A and 10B. As described above, giving no rotation to the pyramid-shaped tip is a characteristic feature of the present invention. The reason why the present invention prohibits to turn the pyramid-shaped tip is as follows.

Figure 10A:
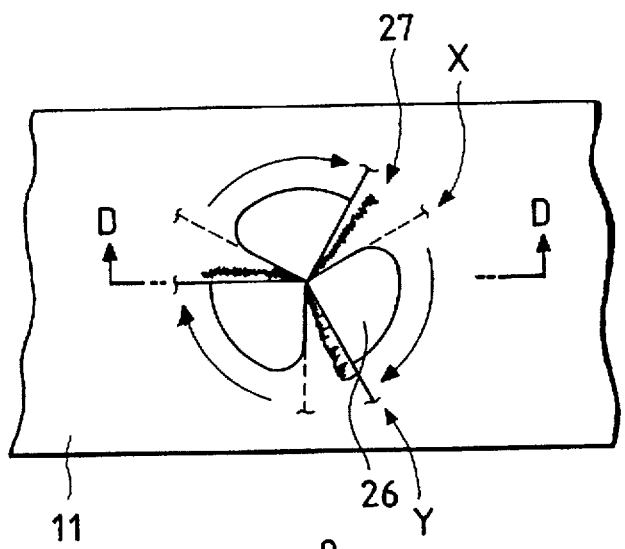
FIG. 10A is a plan view illustrating a problem of turning a test probe contact.
Figure 10B:
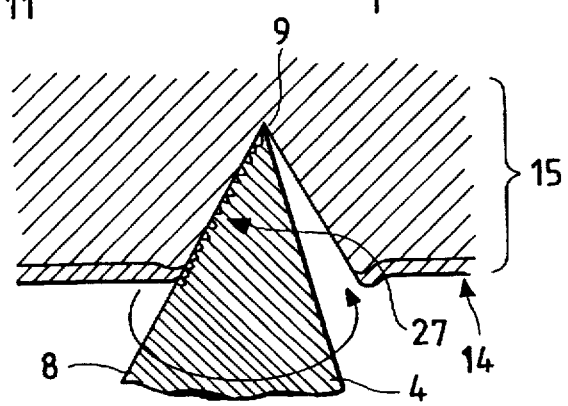
FIG. 10B is a cross-sectional view taken along a line D—D of FIG. 10A.

When the trigonal pyramid-shaped tip is turned, a ridge 8 causes a frictional slide movement about the apex 9 from an angular position X to another angular position Y as shown in a plan view of FIG. 10A. During this turning operation, a significant amount of chip accumulation 27 is formed in front of each ridge 8. This chip accumulation 27 corresponds to a total of flux chips scratched off the surface of the residual flux or oxide film 14 within a sector region 28 in accordance with the rotation of the pyramid-shaped tip 4. Namely, when the pyramid-shaped tip 4 is turned, each ridge 8 shaves the surface of the residual flux or oxide film 14. By this shaving function of the ridge 8, flux chips are forcibly collected along the skirt of each ridge as shown in FIG. 10B. Thus collected chip accumulation 27 becomes a cause of failure in establishing a satisfactory electric connection between the pointed tip 4 and the solder layer 15.

On the other hand, the pyramid-shaped pointed tip 4 of the first embodiment of the present invention is not turned when pressed against the check land 11. Therefore, no chip accumulation is generated. Furthermore, the test probe contact in accordance with the first embodiment of the present invention is simple in configuration because a complicated rotation mechanism is not necessary. And, selection of the spring is relatively free, since there is no necessity of taking account of matching between the spring force and the rotation mechanism or the like.

According to the first embodiment of the present invention, the configuration of the pointed tip 4 is not limited to a trigonal pyramid shape only. For example, the pointed tip 4 can be a quadrangle pyramid shape as shown in FIGS. 8A and 8B. In this case, a cross section normal to the axis of the plunger 1 is a square. In other words, the cross section of the pointed tip 4 normal to an axis of the plunger i has sides having the same length. Regarding the cross section, it is however possible to form a pointed tip 4 whose cross section has sides being different each other in their length.

In short, the configuration of the pointed tip of the first embodiment of the present invention can be any pyramid shape having an apex and a plurality of slant faces meeting at the apex so as to form a ridge between adjacent two slant faces. Furthermore, each slant face, constituting the pointed tip, can be curved in a concave surface or the like as far as at least one sharp edge is formed along a ridge of the pointed tip.

Second Embodiment

Figure 11:
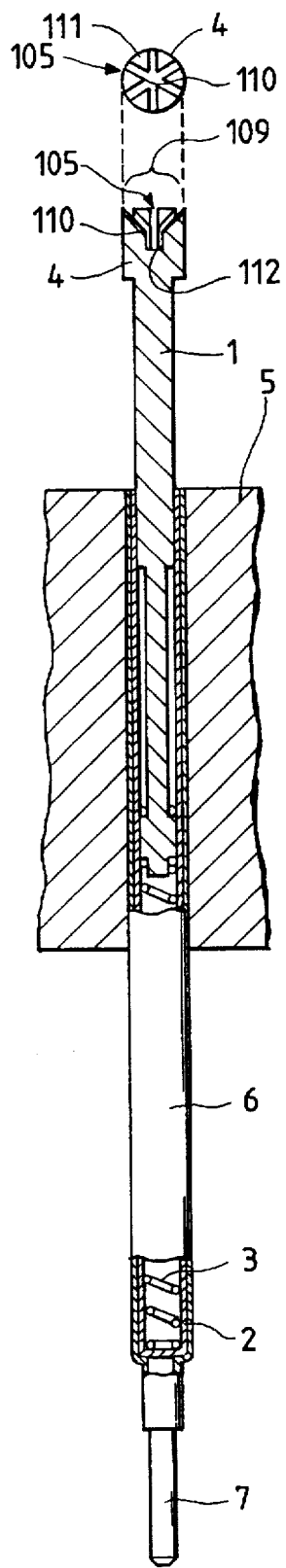
FIG. 11 is a partial sectional view schematically showing an arrangement of a test probe contact in accordance with a second embodiment of the present invention.

FIG. 11 is a partially sectional view schematically showing an arrangement of a test probe contact in accordance with a second embodiment of the present invention. The test probe contact of the second embodiment is characterized in that its contact tip has a concave surface on the top thereof so that the concave surface of the contact tip can be engaged or coupled with a projecting test leg of an electronic component. In other words, the test probe contact of the second embodiment is substantially the same as that of the first embodiment except for the configuration of the tip.

Figure 12:
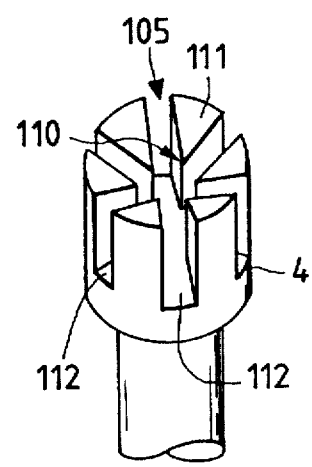
FIG. 12 is an enlarged perspective view showing a concave tip of a plunger of the test probe contact in accordance with the second embodiment of the present invention.

As shown in FIGS. 11 and 12, the contact tip 4 has an upper recessed portion 109 whose configuration basically corresponds to a slope of a reversed right cone. The test probe contact of the second embodiment is brought into contact via this recessed portion 109 with a projecting test leg 114 provided on a printed circuit board 115. Furthermore, on the contact tip 4, there are provided a plurality of slits 105—105 extending radially from the center of the contact tip 4 to the outer peripheral edge of the same. In this embodiment, these slit 105—105 are equally spaced from each other. However, it will be possible to irregularly arrange these slits 105—105. Thus, a plurality of trigonal-shaped portions 111—111 are formed on the upper end of the contact tip 4. Each trigonal-shaped portion 111, being a sector when seen from the top, has a sharp edge 110 at its inner end. Each slit 105 extends toward the barrel 2 so as to have a predetermined depth front the recessed portion 109 to a slit bottom 112. Each slit bottom 112 is inclined downward from the center of the cylindrical contact tip 4 to the outer peripheral edge of the same, as indicated by a dot line in FIG. 13.

Figure 13:
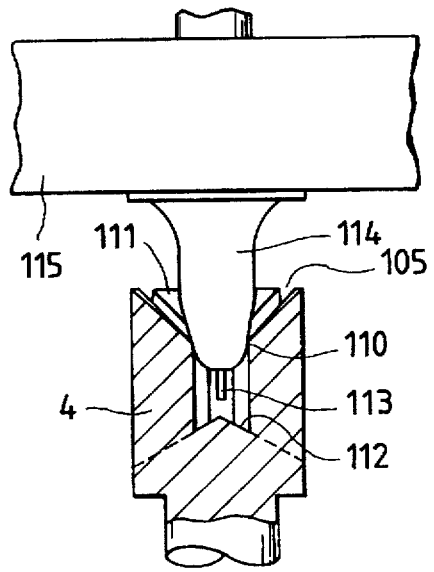
FIG. 13 is a view illustrating a testing condition of the test probe contact in accordance with the second embodiment of the present invention.

When the test probe contact is forced against the projecting test leg 114, the plunger 1 slides in the barrel 2 in its axial direction so as to compress the spring 3. With an elastic force of the spring 3 which is proportional to the amount of compression, the contact tip 4 pushes the projecting test leg 114 in the axial direction of the plunger 1, as shown in FIG. 13. The test leg 114 is an electronic component, such as a connector, which is soldered on the printed circuit board 115. When the contact tip 4 is pressed against the test leg 114, each trigonal-shaped portion 111 forcibly enters or invades into the test leg 114 from its sharp edge 110 and mushes or pushes it away partly, leaving a recess of a trigonal pyramid shape corresponding to the contact tip 4.

Figure 14A:
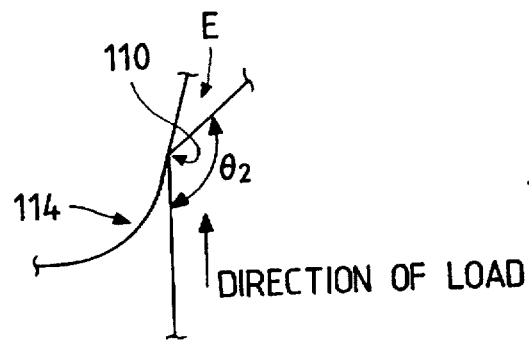
Figure 14B:
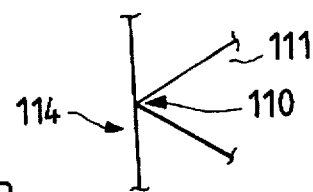

FIG. 14A and 14B are views illustrating a breaking through mechanism in accordance with the second embodiment of the present invention, wherein FIG. 14A is a side view taken along each sharp edge 110 while FIG. 14B is a view seen from a direction of an arrow E.

Figure 15A:
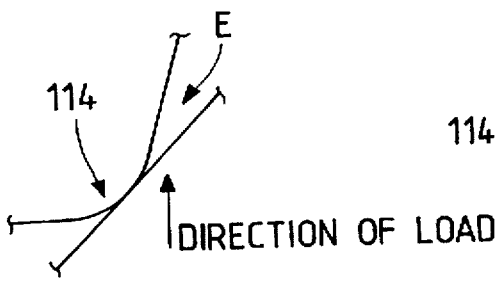
Figure 15B:
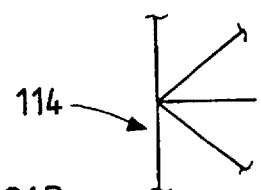

For comparison between the present invention and the prior art, FIGS. 15A and 15B illustrate a contacting condition between a projecting test leg and a conventional concave tip having no edges corresponding to the sharp edges 110—110 of the second embodiment of the present invention, wherein FIG. 15A is a side view while FIG. 15B is a view seen from a direction of the arrow E.

As apparent from the difference of contact condition between FIGS. 14A, 14B and FIGS. 15A, 18B, a large contact pressure is obtained at the edge 110 since a pushing force is concentrated on the edge 110. In other words, according to the second embodiment of the present invention, the pushing force is applied on a pin point on the surface of the test leg 114 due to the configuration of a trigonal-shaped portion 111. Thus, a residual flux or oxide film (not shown) formed on the surface of the test leg 114 is surely broken through by a sharp edge 110, so that a satisfactory electrical connection is established between the contact tip 4 and the metal portion of the test leg 114.

In short, the contact tip of the second embodiment of the present invention can realize both the knife edge effect and the pin point connection effect.

Figure 19:
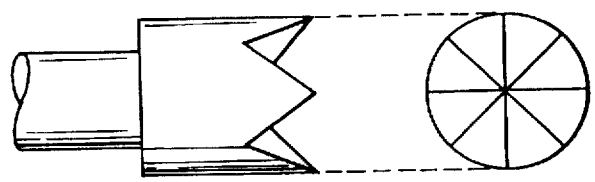
FIG. 19 is an enlarged view showing a conventional concave tip.

On the contrary, the conventional concave tip shown in FIGS. 15A and 15B corresponds to the concave tip of FIG. 19 which has multiple outwardly projecting sharp-pointed tips. This concave tip has no edges corresponding to the sharp edges 110—110 of the second embodiment of the present invention. Therefore, even if a load is applied in an arrow direction of FIG. 15A, only the knife edge effect is expected. Thus, a sufficient force for breaking through the flux or oxide film cannot be obtained, establishing a poor electrical connection between the contact tip 4 and the metal portion of the test leg 114.

In the same manner as the first embodiment, it is essential to give no rotation to the contact tip for realizing the effect (i.e. knife edge effect and pin point connection effect) of the second embodiment of the present invention.

The reason why the present invention prohibits the turning movement of the contact tip is to prevent the formation of an undesirable flux accumulation, which is substantially the same as the first embodiment, the reason of which has been already explained with reference to FIGS. 10A and 10B. Furthermore, the test probe contact in accordance with the second embodiment of the present invention is simple in configuration because a complicated rotation mechanism is not necessary, in the same manner as the first embodiment. Moreover, as the second embodiment can bring a large contact pressure, it is not necessary to increase an elastic force of the spring 3.

Furthermore, each slit 105 functions to effectively discharge flux or oxide chips as soon as they are scratched off the surface of the test leg 114, because its bottom 112 is inclined downward from the center of the cylindrical contact tip 4 to the outer peripheral edge of the same. Thus, accumulation of flux or oxide chips is no longer generated, thereby stabilizing an electrical connection between the contact tip and the test leg. The inclined bottom 112 of each slit 105 is, however, not an essential feature of the present invention. It is needless to say that the satisfactory effect can be obtained regardless of existence of the inclined bottom 112.

To maximize the knife edge effect and the pin point connection effect of the second embodiment of the present invention, the inventors have conducted various experiments and found an optimum result that a preferable edge angle $\theta 2$ is in a range from 120° to 150°. The edge angle $\theta 2$ is defined as an angle of a sectoral upper surface measured from the axis of the plunger 1 in a counterclockwise direction. However, the edge angle $\theta 2$ would be further optimized on the basis of the configuration of each test leg 114 to be coupled with the contact tip 4.

Although the second embodiment shows a total of six slits 105—105, the number of slits 105—105 should be determined taking account of the size of the test leg 114 and a width of each slit 105. According to the second embodiment, at least one edge 110 is required; therefore, it is necessary to form at least two slits 105—105. The width of each slit 105 can be changed. Furthermore, the width of each slot 105 can be increased as it approaches the outer peripheral edge of the cylindrical contact tip 4. With this modification, discharge effect of flux or oxide chips will be promoted.

In a case that the test leg 11 is formed on the printed circuit board 115 using solder, there is a concern that a fringe 113 of solder is formed on the test leg 114 so as to extend downward from the bottom of the test leg 114 as shown in FIG. 113. In such a case, the slit 105 functions to prevent the contact tip 4 from interfering with such a fringe 113.

Third Embodiment

Figure 16:
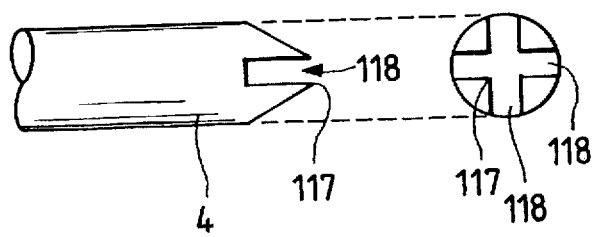
FIG. 16 is an enlarged view showing a tip of a test probe contact in accordance with the third embodiment of the present invention.

FIG. 16 is an enlarged view showing another contact tip of a test probe contact in accordance with the third embodiment of the present invention.

The contact tip 4 of the third embodiment is different from that of the second embodiment in that the configuration of the contact tip 4 is not a recess and is a convex basically corresponds to a slope of a right cone. There are provided four slits 118—118 so as to form a sharp edge 17 between adjacent two slits 118 and 118. Namely, each slit 118 extends radially from the center of the contact tip 4 to the outer peripheral edge of the same. Thus, a plurality of sharply protruding edges are formed on the upper end of the contact tip 4. Each protruding edge, being a sector when seen from the top, has a sharp edge 117 at its inner end. Each slit 118 extends toward the barrel 2 so as to have a predetermined depth from the top to a bottom. This third embodiment can increase the sharpness of each edge 117 and is advantageous when it is brought into contact with a test leg whose protruding edge is not so small as that of FIG. 13. According to this third embodiment, both the knife edge effect and the pin point connection effect can be obtained in the same manner as the second embodiment. Since the sharpness of the edge 117 is large compared with the edge 110 of the second embodiment, the number of the slits 118—118 would be reduced to a smaller number compared with the number of the slits 115—115 of the second embodiment. If the test leg is so small that it can be held in a space surrounded by four edges 117—117, this third embodiment will be preferably applied to such a slim test leg.

Fourth Embodiment

Figure 17:
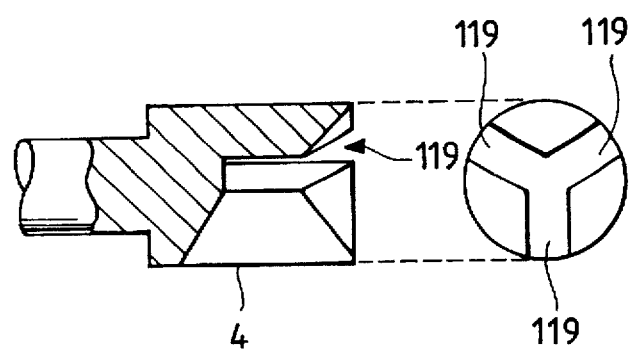
FIG. 17 is an enlarged view showing a tip of a test probe contact in accordance with the fourth embodiment of the present invention.

FIG. 17 is an enlarged view showing a tip of a test probe contact in accordance with the fourth embodiment of the present invention.

This fourth embodiment is similar to the second embodiment, but is different in that the number of slits 119—119 is odd.

Fifth Embodiment

Figure 18:
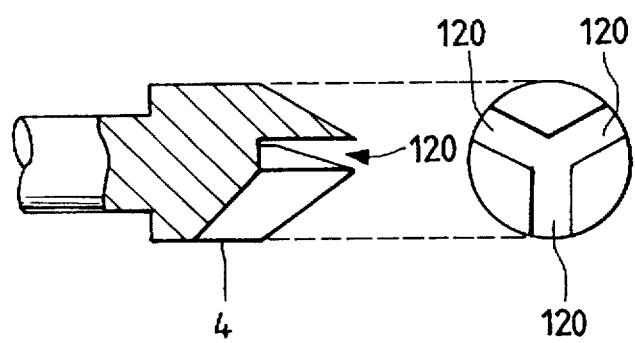
FIG. 18 is an enlarged view showing a tip of a test probe contact in accordance with the fifth embodiment of the present invention.

FIG. 18 is an enlarged view showing a tip of a test probe contact in accordance with the fifth embodiment of the present invention.

This fifth embodiment is similar to the third embodiment, but is different in that the number of slits 120—120 is odd and a bottom of each slit 120 is inclined downward from the center of the contact tip 4 to the outer peripheral edge of the same.

Miscellaneous

Although not shown in the drawings, the top surface of the contact tip can be flat other than convex or concave as far as a sharp edge is formed thereon.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A test probe contact comprising:
   a contact member having a contact tip formed with a plurality of slits, each slit extending radially from a center of said contact tip to an outer peripheral edge thereof and extending axially to have a depth along an axial direction of said contact tip, so as to divide said contact tip into a plurality of sector portions mutually spaced by said radially and axially extending slits and form an edge on and inner axial ridge of each sector portion where adjacent two slits meet, said edge being constructed and arranged to be directly connectable with a test member provided on an electronic component to be tested;
   a holding member holding said contact member therein so that said contact member slides in an axial direction thereof, a sliding movement of said contact member causing said edge of the contact tip to cut into the test member along said edge; and
   an elastic member resiliently supporting said contact member in the axial direction of the contact member for giving an elastic reaction force to said contact member when said contact member is pushed against the test member, thereby breaking through a surface of said test member using said edge so as to establish an electrical connection between the contact tip and the test member.

2. The test probe contact in accordance with claim 1, wherein an upper surface of said contact tip is a recessed surface which is engageable with the test member provided on said electronic component to be tested, and said slits are formed on said recessed surface so as to form the edge between two adjacent slits.

3. The test probe contact in accordance with claim 1, wherein an upper surface of said contact tip is a convex surface, and said slits are formed on said convex surface so as to form said edge between two adjacent slits.

4. The test probe contact in accordance with claim 1, wherein said slits are equally spaced from each other.

5. The test probe contact in accordance with claim 1, wherein said slits are different from each other in their widths and depths.

6. The test probe contact in accordance with claim 1, wherein at least one of said slits has a bottom inclined downward from the center of the contact tip to the outer peripheral edge of said contact tip.

7. The test probe contact in accordance with claim 1, wherein said contact member is made of an electrically conductive member and at least one of said holding member and said elastic member is made of an electrically conductive member.

8. A probe comprising:
   a tip having a plurality of slits each radially and axially extending from a top center of the tip,
   an edge constructed and arranged to be directly connectable with a test member provided on a circuit board,
   wherein said tip is divided into a plurality of sector portions mutually spaced by said radially and axially extending slits and said edge is formed on an inner axial ridge of each sector portion where two adjacent slits of said plurality of slits meet.

9. The probe in accordance with claim 8, wherein a surface of said tip on which said slits are formed is a recessed portion, and said edge is formed in said recessed portion.

10. The probe in accordance with claim 8, wherein a surface of said tip on which said slits are formed is a concave portion, and said edge is formed at a tip end of said concave portion.

11. The probe in accordance with claim 8, wherein said slits are identical with each other in both width and depth.

12. The probe in accordance with claim 8, wherein said slits are different with each other in both width and depth.

13. The probe in accordance with claim 8, wherein at least one of said slits has a bottom inclined downwardly from a center of said probe to an outer peripheral edge of said probe.

* * * * *